United States Patent
Avraham et al.

(10) Patent No.: US 10,892,784 B2
(45) Date of Patent: Jan. 12, 2021

(54) MEMORY DEVICE WITH ENHANCED ERROR CORRECTION VIA DATA REARRANGEMENT, DATA PARTITIONING, AND CONTENT AWARE DECODING

(71) Applicant: Western Digital Technologies, Inc., San Jose, CA (US)

(72) Inventors: Dudy Avraham, Even Yehuda (IL); Omer Fainzilber, Herzeliya (IL); Tommer Kuper Lotan, Tel Aviv (IL); Eran Sharon, Rishon Lezion (IL); Ofir Pele, Hod HaSharon (IL); Stella Achtenberg, Netanya (IL); Ran Zamir, Ramat Gan (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/430,380

(22) Filed: Jun. 3, 2019

(65) Prior Publication Data

US 2020/0382143 A1    Dec. 3, 2020

(51) Int. Cl.
*H03M 13/37* (2006.01)
*G06F 11/10* (2006.01)

(52) U.S. Cl.
CPC ..... *H03M 13/3707* (2013.01); *G06F 11/1076* (2013.01); *H03M 13/3761* (2013.01)

(58) Field of Classification Search
CPC .......... H03M 13/3707; H03M 13/3761; G06F 11/1076
See application file for complete search history.

(56) References Cited

U.S. PATENT DOCUMENTS

| | | | |
|---|---|---|---|
| 6,532,564 B1* | 3/2003 | Ito | H04L 1/0057 714/752 |
| 2008/0050047 A1 | 2/2008 | Bashyam et al. | |
| 2009/0187803 A1 | 7/2009 | Anholt et al. | |
| 2012/0197877 A1* | 8/2012 | Tunkelang | G06F 16/3331 707/723 |
| 2012/0263156 A1* | 10/2012 | Abraham | H04L 5/0044 370/338 |
| 2013/0080045 A1* | 3/2013 | Ma | G06T 7/12 701/408 |
| 2014/0172773 A1* | 6/2014 | Schmidt | G06N 7/00 706/54 |
| 2014/0180974 A1* | 6/2014 | Kennel | G06Q 40/025 706/12 |

(Continued)

OTHER PUBLICATIONS

PCT International Search Report dated Apr. 17, 2020, PCT Patent Application No. PCT/US2019/066655.

(Continued)

*Primary Examiner* — Guy J Lamarre
(74) *Attorney, Agent, or Firm* — Vierra Magen Marcus LLP

(57) ABSTRACT

Disclosed herein are memory devices, systems, and methods of encoding and decoding data. In one aspect, an encoded data chunk is received and segmented into data segments with similar features. Each segment can be decoded based on its features. Data can also be rearranged and partitioned so as to minimize an entropy score that is based on the size and entropy of the data partitions. The approach is capable of enhancing performance, reducing decoding latency, and reducing power consumption.

20 Claims, 11 Drawing Sheets

(56) References Cited

U.S. PATENT DOCUMENTS

2015/0212887 A1* 7/2015 Dhuse .................. G06F 3/0619
714/770
2016/0259960 A1* 9/2016 Derakhshani ........ G06K 9/6215

OTHER PUBLICATIONS

PCT Written Opinion of the International Searching Authority dated Apr. 17, 2020, PCT Patent Application No. PCT/US2019/066655.

* cited by examiner

MEMORY DEVICE WITH ENHANCED ERROR CORRECTION VIA DATA REARRANGEMENT, DATA PARTITIONING, AND CONTENT AWARE DECODING

BACKGROUND

The following description is provided to assist the understanding of the reader. None of the information provided or references cited are admitted to be prior art.

Electronic data stored in computer memory devices can suffer, to varying degrees, from data corruption that introduces unintended errors to data during writing, reading, storing, transmitting, or processing. Data corruption can result in loss of valuable data and system crashes. Endurance and reliability are key features in storage devices, especially at challenging scenarios near the NAND's end of life.

A controller associated with a memory device may employ error correction code (ECC) decoders to manage data errors and ensure high reliability in storage systems. ECC decoders, such as a low-density parity-check (LDPC) decoder, may base error correction on the probability that each bit has flipped (e.g., that a one should be a zero or vice-versa). In the common case in which underlying statistics for the data are unknown, the ECC decoder uses default parameters that correspond to the case of uniform distribution of the data. Soft ECC decoders can increase performance if underlying statistics of encoded data is known.

SUMMARY

Embodiments disclosed herein relate to devices, systems, and methods that use local statistics for decoding and do not treat the data as a homogenous output of a single data source. The data may be viewed as a combination of multiple sources, each with its unique properties and statistics. This approach can increase correction capability and reduce decoding latency and power consumption. Improvement can additionally be achieved by having more structured data by, for example, uncovering hidden structures in the data to further enhance correction capability and reduce decoding latency and power consumption. The disclosed approach may apply a transformation on the data prior to encoding such that the encoded data is arranged into several partitions, where each partition is highly structured with different source statistics, and in return, the decoder will be able to decode a larger number of bit flips. After a transformation, partitions can vary in size. Additionally, separation points between the different partitions can be found, with each partition considered as a different source with different source statistics that can be used in order to leverage the decoder's correction capabilities.

Various embodiments disclosed herein are related to a memory controller. The memory controller may be configured to interface with a host system and a memory device. The memory controller may receive unencoded data from a host system, transmit decoded data to the host system, receive encoded data from a memory device, and/or transmit encoded data to the memory device for storage. The memory controller may comprise one or more processors and a memory storing instructions that, when executed by the one or more processors, cause the one or more processors to perform specific functions. The memory controller may be configured to receive encoded data from a memory device. Also, the memory controller may be configured to segment the encoded data into multiple segments. The encoded data may be segmented such that each segment has a minimum word length. Additionally or alternatively, the encoded data may be segmented such that segments are sufficiently different. Segments may contain data with significantly different source statistics. Moreover, the memory controller may be configured to decode the segments. The segments may be decoded by applying different decoder parameters to each segment. Further, the memory controller may be configured to transmit the decoded data to a host system.

In one or more embodiments, the memory controller may be configured to decode each segment by applying decoder parameters optimized for the segment. The decoder parameters applied to each segment may be optimized for the segment according to its source statistics. The decoder parameters could be the confidence level assigned to each bit such that different sets of confidence levels are used for different segments. One such example can be found at Equation 1 below, describing the assigned LLR values according to the channel and segment statistics. In one manifestation, parameters can be compactly saved as symbol probabilities per segment.

In one or more embodiments, the memory controller may be configured to segment the encoded data at least in part by choosing a size and determining similarity between segment candidates of the chosen size.

In one or more embodiments, the memory controller may be configured to determine similarity at least in part by determining Hamming distance between segment candidates.

In one or more embodiments, the memory controller may be configured to determine similarity at least in part by determining at least one of Jensen-Shannon Divergence and Kullback Leibler Divergence between segment candidates.

In one or more embodiments, the memory controller may be configured to determine similarity at least in part by determining whether segment candidates have a correlation metric exceeding a correlation threshold.

In one or more embodiments, the memory controller may be configured to join segment candidates together into a single segment if the correlation metric between the segment candidates exceeds the correlation threshold.

In one or more embodiments, the memory controller may be configured to iteratively increase segment size and determine whether each segment can explain longer words.

In one or more embodiments, the memory controller may be configured to receive unencoded data from the host system, encode the unencoded data to obtain the encoded data, and transmit the encoded data to the memory device for storage.

In one or more embodiments, the memory controller may be configured to perform an invertible transformation on the unencoded data prior to encoding the data. The transformation may be performed so as to rearrange the data into a collection of partitions with unique source statistics.

In one or more embodiments, the memory controller may be configured to perform the invertible transformation at least in part by performing a Burrows-Wheeler transform.

In one or more embodiments, the controller may be configured to find separation points between partitions in the collection of partitions. The separation points may be found so as to reduce an entropy metric for the collection of partitions.

Various embodiments disclosed herein are related to a method. The method may comprise receiving unencoded data from a host system. Also, the method may comprise performing a transformation on the unencoded data. The transformation may be invertible. The transformation may be performed so as to rearrange the unencoded data into a collection of partitions. The partitions in the collection of partitions may have unique source statistics. Moreover, the method may comprise encoding the unencoded data to generate encoded data. Additionally, the method may comprise storing the encoded data in a memory device.

In one or more embodiments, the method may comprise receiving the encoded data from the memory device, and determining separation points for the collection of partitions.

In one or more embodiments, determining separation points may comprise determining separation points between partitions in the collection of partitions so as to reduce an entropy metric for the collection of partitions.

In one or more embodiments, the method may comprise providing the encoded data and the separation points to a decoder. The method may also comprise decoding the encoded data to obtain decoded data.

In one or more embodiments, the method may comprise performing an inverse transformation on the decoded data.

In one or more embodiments, decoding the encoded data may comprise segmenting the encoded data into multiple segments such that segments are sufficiently different, and applying different decoder parameters to each segment.

In one or more embodiments, the similarity may be determined by determining at least one of a Hamming distance, a Jensen-Shannon Divergence, and a Kullback Leibler Divergence between segment candidates.

In one or more embodiments, performing the invertible transformation may comprise performing a Burrows-Wheeler (BW) transform.

Various embodiments disclosed herein are related to a method of controlling a memory system. The method may comprise encoding unencoded data. The unencoded data may be encoded at least in part by performing a transformation on the unencoded data. The transformation may be invertible. The transformation may be performed so as to rearrange the unencoded data into a collection of partitions. The partitions may have unique source statistics. Also, the method may comprise determining separation points for the collection of partitions. The separation points may be determined so as to reduce an entropy metric for the collection of partitions. Moreover, the method may comprise decoding encoded data. Encoded data may be decoded at least in part by applying different decoder parameters to unique segments of the encoded data. Additionally, the method may comprise performing an inverse transformation on the decoded data.

Various embodiments disclosed herein relate to a memory controller. The memory controller may be configured to receive data from a host system. The memory controller may be configured to rearrange the received data into a collection of partitions with unique source statistics. The memory controller may be configured to encode the rearranged collection of partitions data. The memory controller may be configured to store the encoded data in a memory device.

In one or more embodiments, the memory controller may be configured to decode the stored data at least in part by applying different optimized decoder parameters per segment of the collection of partitions encoded data.

In one or more embodiments, the memory controller may be configured to rearrange the received data at least in part by performing an invertible transformation on the received data.

In one or more embodiments, the memory controller may be configured to determine separation points for the collection of partitions.

In one or more embodiments, the memory controller may be configured to determine separation points for the collection of partitions at least in part by determining separation points between partitions in the collection of partitions so as to reduce an entropy metric for the collection of partitions.

In one or more embodiments, the memory controller may be configured to decode the encoded data to obtain decoded data. The memory controller may also be configured to perform an inverse transformation on the decoded data.

In one or more embodiments, the memory controller may be configured to perform the invertible transformation at least in part by performing a Burrows-Wheeler (BW) transform.

In one or more embodiments, the memory controller may be configured to decode the encoded data at least in part by segmenting the encoded data into multiple segments such that segments are sufficiently different. The memory controller may be configured to apply different optimized decoder parameters to each segment.

In one or more embodiments, the memory controller may be further configured to determine similarity at least in part by determining at least one of a Hamming distance, a Jensen-Shannon Divergence, and a Kullback Leibler Divergence between segment candidates.

BRIEF DESCRIPTION OF THE DRAWINGS

FIGS. 6A and 6B illustrate the effect of using the Burrows-Wheeler transform on a real text file, with FIG. 6A depicting the beginning of the original file and FIG. 6B depicting the same data after performing the transform, according to one or more example embodiments.

Figure 1:
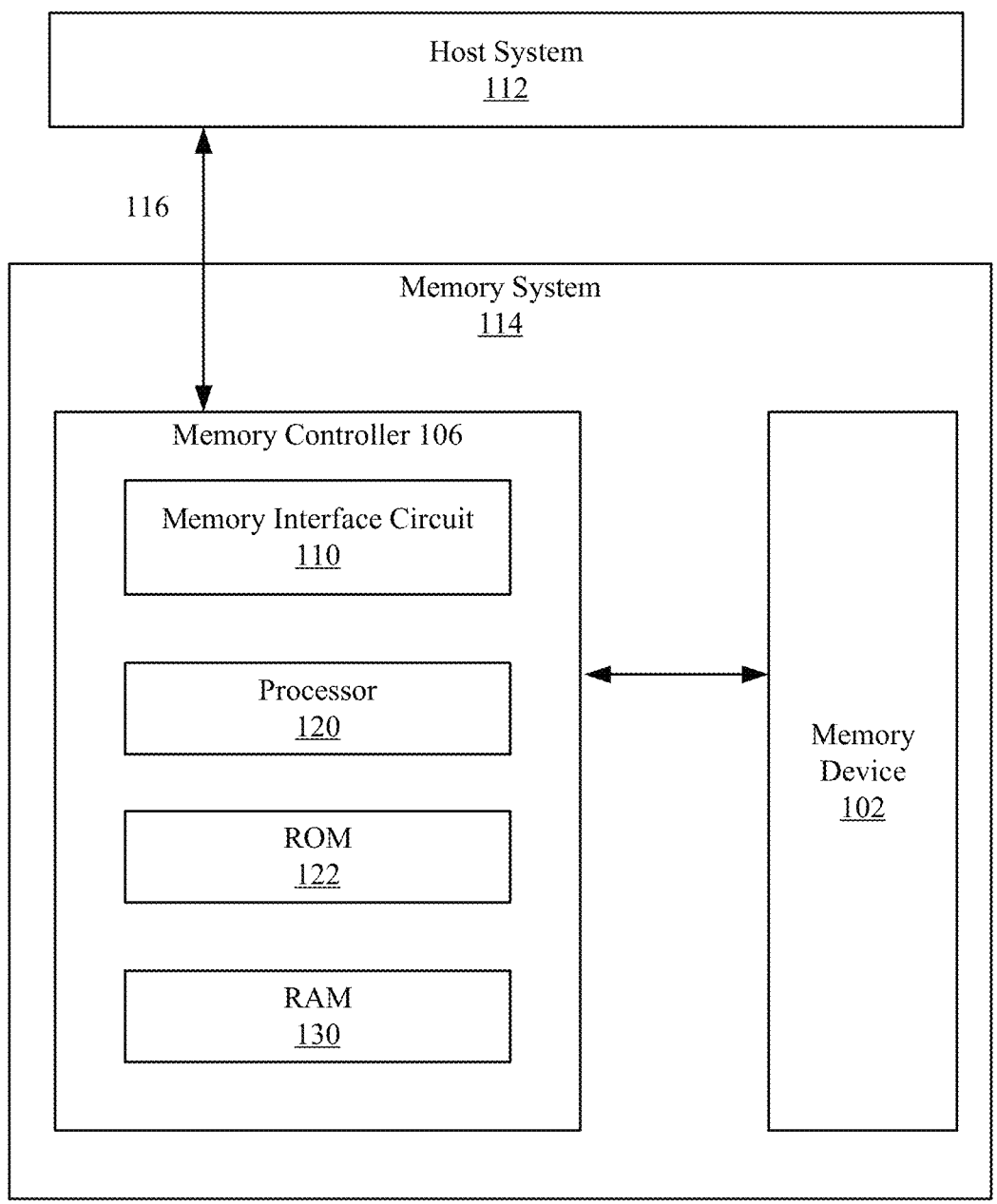
FIG. 1 is a block diagram of a computer system according to one or more example embodiments.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed herein are methods, devices, and systems for using local statistics and not treating data as a homogenous output of a single data source, but rather as a combination of multiple sources each with its unique properties and statistics. A storage system implementing this approach can improve its endurance and reduce firmware overhead related to error handling. The storage system can also improve decoding latency and improve the QoS (quality of service) profile of the system. In various embodiments, this aspect of the invention may be especially useful to patterned data, which describes other management data, such as management tables, and user data. This management information is of great importance to the system's operation, and improving its storage reliability is crucial.

Also disclosed herein are methods, devices, and systems for applying a transformation on data prior to encoding such that the encoded data is arranged into several partitions, where each partition is highly structured with different source statistics, and in return, the decoder will be capable to decode larger number of bit flips. Because partitions can have variable sizes after transformation, separation points between the different partitions can be found, with each partition considered as a different source with different source statistics that can be used in order to leverage the decoder's correction capabilities. As a result of one or both of the above approaches, enhanced correction capability may be achieved, and decoding time and power consumption may be reduced. Decoding herein refers to converting data in encoded form into a decoded form, and encoding refers to converting data to be stored into encoded form. Examples of decoding include ECC (error correction code) decoding, and examples of encoding include ECC encoding.

Previous approaches assumed the data is of a single source. However, if the data contains several sources each of which is from a different distribution, prior methods resulted in loss of critical decoding information. In example embodiments of the disclosed approach, the data is modeled as a mixture of several sources each of which contains its own statistics model. In implementations of the described approach, the number of sources is estimated and statistics are gathered to describe them, helping optimize content awareness. Moreover, rearranging the data such that it is clear that the data can be divided into several different sources can result in higher efficiency in the correction capability of a decoder. Various embodiments involve searching for optimal separation points between different sources and using variable-length windows to cover each one of the sources in the data.

Figure 6A:
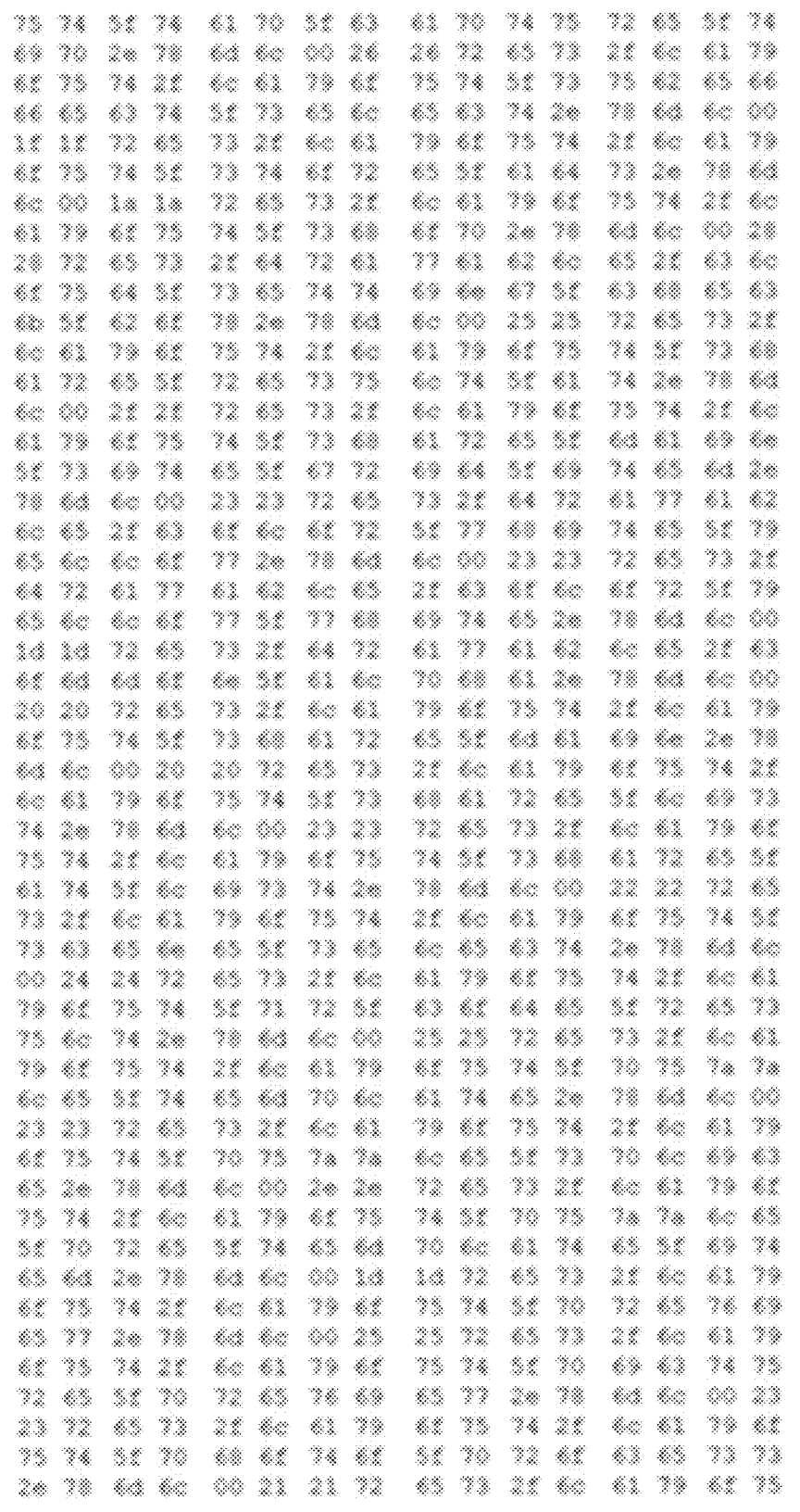
Figure 6C:
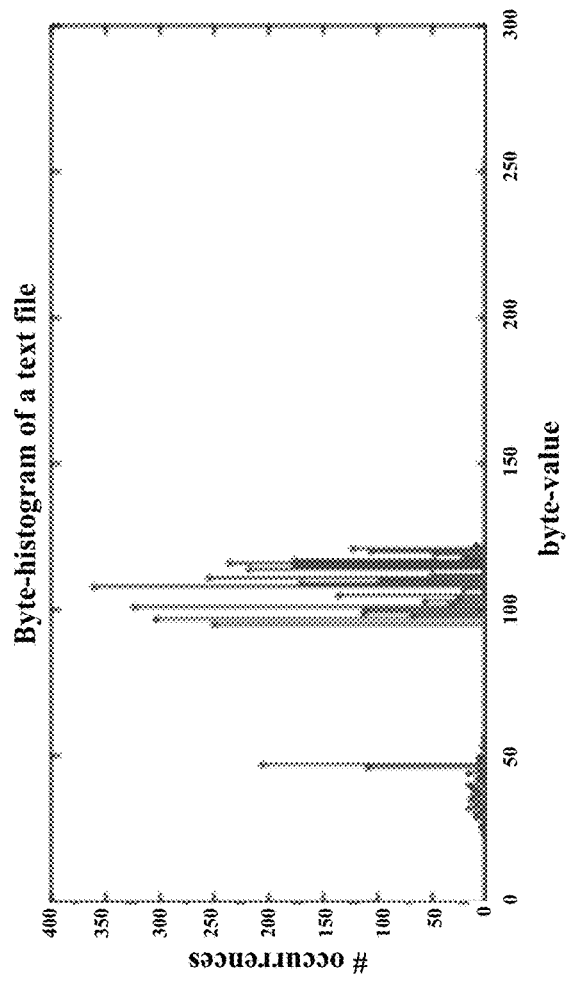
FIG. 6C depicts an example byte-histogram of a text file.

To help explain why use of source statistics (data signatures or characterizations of patterns in data) improves decoder performance, it is useful to define the properties that are tracked in the data. For example, in text files, it is easier to think of the data as a collection of characters, where each character is represented by 8 bits. Thus, we can use a byte-histogram of the data that represents the probability of each byte-value to occur. An example of a byte-histogram of a text file can be seen in FIG. 6C. The decoder is able to incorporate these data properties during decoding (by, e.g., adjusting decoder parameters).

Without loss of generality, the byte-histogram will be used as an example in portions of the discussion. The byte-histogram is only one example of the source statistics that can be tracked from the data. Histograms are very good estimates of the data source that produced the user data. As more data are collected, the estimation accuracy improves. However, if the data are generated from several sources, then the histogram will be a mix of multiple distinct distributions, and depending on the amount of data from each source, some may overpower others. Separating the data into several partitions, each of which is from a different source, can significantly improve decoder performance. In various embodiments, this observation is implemented by (1) using invertible transformation in order to rearrange the data into a collection of partitions, where each partition is highly structured with unique source statistics; and/or (2) using an algorithm to find the optimal separation points between the different partitions.

With respect to the first item, this approach involves transforming user data into a collection of partitions, in which each partition is highly structured with unique source statistics. The transformation is reversible, such that the original data can be retrieved at any time. Moreover, the transformation is performed prior to encoding because decoding is performed and all bit flips cleaned before performing the inverse transformation.

In certain embodiments, this transformation can be performed using the Burrows-Wheeler (BW) transform. The BW transform, originally introduced in relation to compression, rearranges a character string into runs of similar characters. In one example, without the loss of generality, the set of characters is the set of all possible values of a byte. In FIGS. 6A and 6B, the effect of using BW transform on a real text file can be observed. FIG. 6A depicts the beginning of the original file and FIG. 6B depicts the same data after performing the BW transform. We can see that the data after the BW transform is more structured and it is easier to divide the data into different partitions where each partition is governed by different source statistics. For example, in one partition, the byte-value "6c" is more dominant, whereas in another partition the byte-value "75" is more dominant, and so on.

Previous decoders may have received only a single byte-histogram that represents the source statistics of the whole data. In order to increase the correction capability of the decoder, several byte-histograms can be provided, one for each partition, so the decoder will be able to adjust its parameters for each different section in the data.

By using the BW transform, for example, different partitions with different source statistics can be defined, and this information provided to the decoder. In some implementations, a predefined partitioning may be used to achieve a performance gain. For example, the BW transform can be applied and the data divided into eight equal sections, and the byte-histogram can be computed for each section.

In various embodiments, distinguishing between the different partitions—how many are there and where each one of them starts—achieves a more significant gain, as further discussed below.

FIG. 1 is a block diagram of a computer system 100, according to example embodiments. The computer system 100 includes a memory system 114 operating according to commands from a host system 112. The computer system 100 can be any electronic device such as a personal computer, a server computer, a laptop, a smart phone, a tablet computer, a smart watch, etc. The memory system 114 communicates with the host system 112 (e.g., in some implementations, an operating system or application) through a host interface 116. The memory system 114 may be in the form of a removable memory such as a memory card or drive, or may be in the form of an embedded memory system.

The memory system 114 includes a memory device 102 and a memory controller 106. The memory controller 106 is a circuit that controls operations of the memory device 102, according to commands from the host system 112. The memory device 102 may comprise one or more arrays of memory cells distributed over one or more integrated circuit chips.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination thereof.

The memory device 102 can be formed from passive and/or active elements, in any combinations and may include a plurality of memory cells. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may contain memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over which the memory elements are formed or a layer in which the memory elements are formed. The substrate may also be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but covers all relevant memory structures within the spirit and scope as described herein.

The memory controller 106 controls operations of the memory device 102. In one embodiment, the controller 106 includes a memory interface circuit 110, a processor 120, read-only memory (ROM) 122, and random access memory (RAM) 130. In one aspect, ROM 122 and/or RAM 130 constitute a non-transitory computer readable medium that stores instructions that, when executed by the processor 120, cause the processor 120 to perform various functions disclosed herein. These components may be embodied as an application specific integrated circuit, field programmable gate array, other controller embodiments known to those of ordinary skill in the art, or a combination of one or more of these implementations.

The memory interface circuit 110 is a circuit that interfaces between the host system 112 and the memory device 102. In one configuration, the memory interface circuit 110 is coupled between the host system 112 and the memory device 102. In this configuration, the memory interface circuit 110 stores data at the memory device 102 or reads data from the memory device 102, according to a request from the host system 112.

For storing data, in response to a request from the host system 112 to store data, the memory interface circuit 110 stores the data at the memory device 102. The memory interface circuit 110 may encode the data and store the encoded data at the memory device 102. For reading data, in response to a request from the host system 112 to read data, the memory interface 110 retrieves the stored data from the memory device 102 and provides the retrieved data to the host system 112. The memory interface circuit 110 may decode the encoded data using a set of decoding parameters and provide the decoded data to the host system 112.

Figure 2:
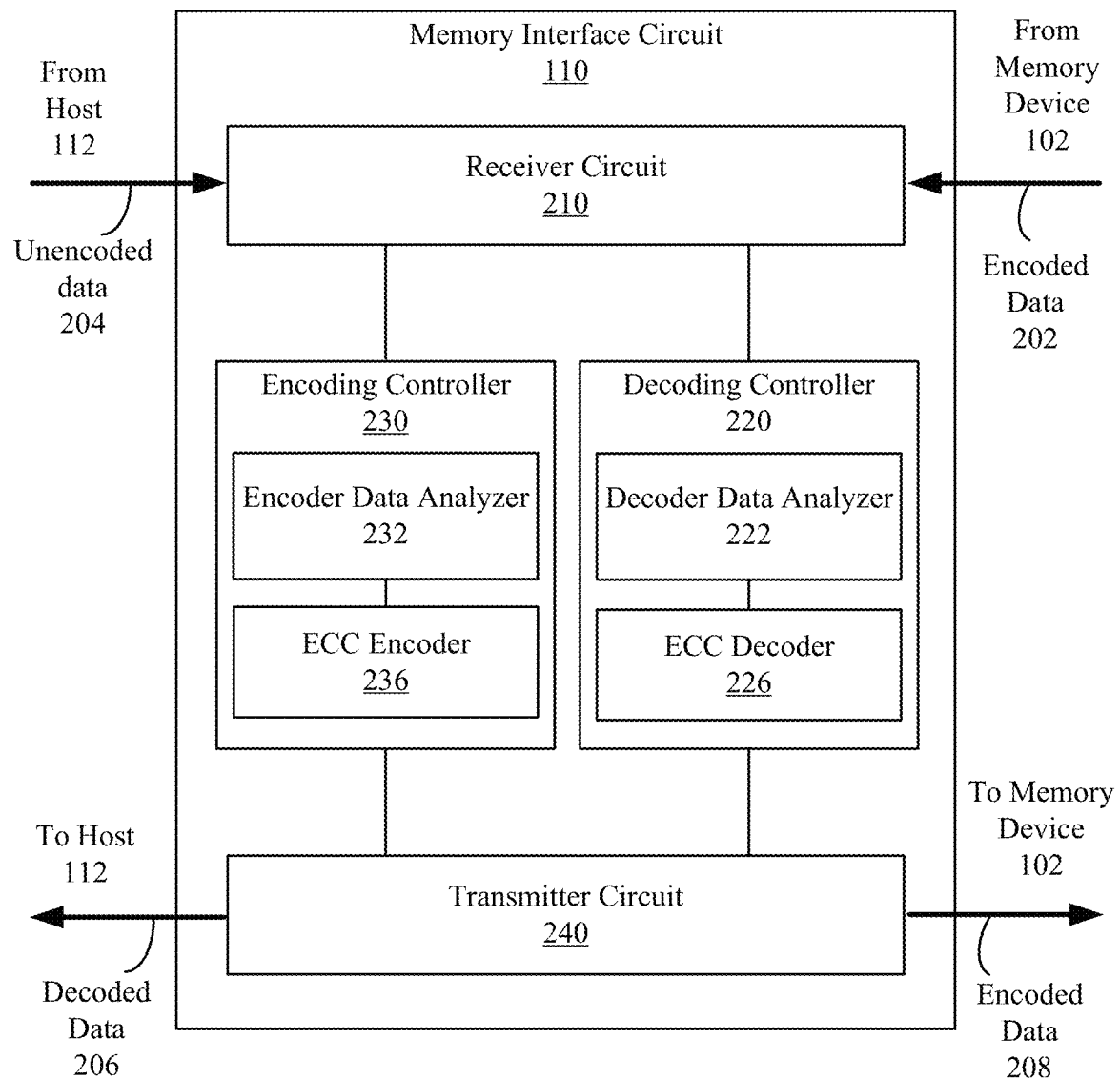
FIG. 2 is a memory interface circuit including a decoding controller, according to one or more example embodiments.

FIG. 2 is a memory interface circuit 110 according to example embodiments. The memory interface circuit 110 includes a receiver circuit 210, a decoding controller 220, an encoding controller 230, and a transmitter circuit 240. These components operate together to store data in and/or read data from the memory device 102. These components may be embodied as application specific integrated circuit (ASIC), a field programmable gate array (FPGA), or a combination thereof. In other embodiments, the memory interface circuit 110 includes more, fewer, or different components than shown in FIG. 2.

The receiver circuit 210 may be any circuit configured to receive data and/or instructions from host 112, and/or receive data stored in memory device 102. In one configuration, the receiver circuit 210 is coupled to a plurality of memory cells of the memory device 102. In other embodiments, a receiver may be utilized in place of the receiver circuit 210. As used herein, a receiver may comprise any component, logic, circuit, or the like configured to receive data stored by one or more cells. In one embodiment, the receiver includes the receiver circuit 210. In another embodiment, two or more components may cooperate to serve as a receiver.

The receiver circuit 210 may receive a request from host 112 to read data stored in memory device 102. When data is to be read, an address identifying a location in memory device 102 from which data is to be read may be provided by host 112. In other embodiments, the data to be read is identified without providing an address, and the location in memory device 102 is determined by memory interface circuit 110 by, for example, cross-referencing a table providing addresses for particular data. The receiver circuit 210 may then retrieve the data 202, which may be stored in encoded form, and which may have bit flips, from one or more memory cells of memory device 102. The receiver circuit 210 may provide the encoded data 202 to the decoding controller 220 before the data is provided to host 112.

The receiver circuit 210 may also receive a request from host 112 to write data to memory device 102. The data 204 to be written may be provided by host 112 in un-encoded form. In some implementations, the location in memory device 102 at which the un-encoded data is to be stored may be determined by memory interface circuit 110 or, in other implementations, an address identifying a location in memory device 102 may be provided by host 112. The receiver circuit 210 may provide the un-encoded data 204 to the encoding controller 230 for encoding before being provided to memory device 102.

The decoding controller 220 is any circuit configured to receive the encoded data 202. In one configuration, the decoding controller 220 is coupled to the receiver circuit 210 and receives the encoded data 202 from the receiver circuit 210. In one aspect, the decoding controller 220 determines which decoding parameters to use for decoding the encoded data 202 before starting to decode the encoded data 202. In one approach, the decoding controller 220 determines which decoding parameters to use based at least in part on characteristics of the data using decoder data analyzer 222. The characteristics of encoded data 202 may be based on, for example, the source of the data (e.g., the application that generated, or the device or user that provided, the data that was encoded to generate encoded data 202). In some implementations, source statistics can be used as metrics for characterizing data (such as patterns in the data that result when data are generated by the same application or are otherwise from the same source). The source statistics for data chunks can be compared with each other to identify suitable decoder parameters that can more efficiently and/or more accurately decode encoded data. The decoder data analyzer 222 is, in various embodiments, configured to determine source statistics and compare the source statistics of data chunks to determine correlations between data chunks.

The ECC decoder 226 may be any circuit configured to perform decoding according to decoding parameters (and/or other decoding configuration data) from the decoding controller 220. In one configuration, the ECC decoder 226 is coupled to the decoder data analyzer 222. As used herein, a decoder may comprise any component, logic, circuit, or the like configured to perform decoding according to decoding configuration data. In another embodiment, two or more components may cooperate to serve as a decoder. The ECC decoder 226 receives the encoded data 202 and decoding configuration data from the decoder data analyzer 222, and decodes the encoded data 202 according to the decoding configuration data. In some embodiments, the ECC decoder 226 is a means for decoding data according to the statistics of the encoded data 202. In one aspect, the decoding configuration data is indicative of statistics of the encoded data 202, where the statistics are correlated to content (e.g., what is contained in) or a type (or other characteristics) of data encoded. Hence, the ECC decoder 226 may perform content-aware decoding by decoding the encoded data 202 according to decoding configuration data that is based on characteristics of the data.

The encoding controller 230 is any circuit configured to receive the un-encoded data 204. In one configuration, the encoding controller 230 is coupled to the receiver circuit 210 and receives the un-encoded data 204 from the receiver circuit 210. In one aspect, the encoding controller 230 identifies characteristics of data. The characteristics may be determined by an encoder data analyzer 232. The characteristics may include source statistics that serve as metrics for characterizing data (such as patterns in the data that result when data are generated by the same application or are otherwise from the same source). The encoder data analyzer 232 may also determine how data is to be rearranged and/or partitioned prior to encoding.

An ECC encoder 236 is any circuit configured to encode data according to ECC encoding parameters or other encoder configuration data. In one configuration, the ECC encoder 236 is coupled to the encoder data analyzer 232. As used herein, an encoder may comprise any component, logic, circuit, or the like configured to perform encoding according to encoding configuration data (which may be provided by, e.g., encoding controller 230). In another embodiment, two or more components may cooperate to serve as an encoder. The ECC encoder 236 receives the un-encoded data 204 and encodes the un-encoded data 204 according to the encoding parameters. In various approaches, the encoder data analyzer 232 identifies characteristics of un-encoded data 204 prior to, during, or after the un-encoded data 204 is encoded by ECC encoder 236.

The transmitter circuit 240 is any circuit configured to transmit data to the host 112 or to the memory device 102. In one configuration, the transmitter circuit 240 is coupled to the decoding controller 220 and the encoding controller 230. In other embodiments, a transmitter may be utilized in place of the transmitter circuit 240. As used herein, the transmitter may comprise any component, logic, circuit, or the like configured to transmit data to the host 112 (e.g., as part of a read operation) or to the memory device 102 (e.g., as part of a write operation). In one embodiment, the transmitter includes the transmitter circuit 240. In another embodiment, two or more components may cooperate to serve as a transmitter. The transmitter circuit 240 can receive decoded data from the decoding controller 220 and transmit the decoded data 206 to the host 112, and can receive encoded data from the encoding controller 230 and transmit the encoded data 208 to the memory device 102.

In many cases, the data (content) which is programmed to the NAND is structured. The structure can be a property of the user source (e.g., text, or a byproduct of the NAND usage, such as tables written by the firmware). Data statistics can increase the probability of successful decoding and reduce latency. In some cases, data patterns may have local characteristics, such as data that are padded with zeros or patterns that are based on data repetition. In one aspect of the disclosure, local statistics in the data are used to improve the data estimation by content aware decoders. Described herein is a robust data segmentation approach which locates various-length similar parts of data and groups them to (non-continuous) segments in order to improve the estimation of the a-prior probabilities of the decoder.

In various implementations, content information may be incorporated into ECC decoders. In order to ensure high reliability in solid-state drives (SSDs) and other storage systems, the written data may be protected with an ECC code, such as LDPC codes with soft decoders. In soft decoders, the log-likelihood ratio (LLR) may be used for describing the probability of the read data to be one or zero. If the read data is a vector of measures y, the LLR value of bit i is calculated according to the following formula:

$$LLR_i = \log_2\left(\frac{Pr\{bit_i = 0 / \underline{y}\}}{Pr\{bit_i = 1 / \underline{y}\}}\right) = \quad \text{Eq. 1}$$

$$\log_2\left(\frac{Pr\{\underline{y}/bit_i = 0\} \cdot Pr\{bit_i = 0\}}{Pr\{\underline{y}/bit_i = 1\} \cdot Pr\{bit_i = 1\}}\right) == \underbrace{\log_2\left(\frac{Pr\{\underline{y}/bit_i = 0\}}{Pr\{\underline{y}/bit_i = 1\}}\right)}_{LLR\_Channel} +$$

$$\underbrace{\log_2\left(\frac{Pr\{bit_i = 0\}}{Pr\{bit_i = 1\}}\right)}_{LLR\_Source} == \underbrace{\log_2\left(\frac{Pr\{\underline{y}/bit_i = 0\}}{Pr\{\underline{y}/bit_i = 1\}}\right)}_{LLR\_Channel} +$$

$$\underbrace{\log_2\left(\frac{\sum_j Pr\{bit\_i = 0 \mid bit_i \in Segment_j\} \cdot Pr\{bit_i \in Segment_j\}}{\sum_j Pr\{bit_i = 1 \mid bit_i \in Segment_j\} \cdot Pr\{bit_i \in Segment_j\}}\right)}_{LLR\_Source}$$

The LLR_Channel portion of Equation 1 is based on the statistics of the channel (e.g., the NAND) and may be assumed to be identical to all the data that is passed through the given channel. The LLR_Source portion of Equation 1 is based on the statistics of the source or sources, where, for every bit the statistics of its source is used to determine its probability.

In the absence of prior knowledge, it is common to assume that the source data is uniformly distributed (Pr{$bit_i$=0}=Pr{$bit_i$=1}=0.5) which means that the LLR_Source portion is equal to zero. Thus the term for the LLR becomes the more commonly used LLR_Channel. Further, it is common practice in storage systems to scramble the data, using pseudo random string, thus the assumption of uniform distribution is valid. However, as the encoded data can be descrambled, the structure and the statistics of the original data can be uncovered. Thus, the LLR_Source can be calculated and used in LLR computations.

In various implementations, a base segment which contains all the data that have a similar histogram is assumed. All of these parts are labeled as the base segment. The process is repeated until all data is either in new segments or in the base segment. Thus, it can be ensured that if the data belongs to a single source it will not be segmented forcefully into several segments.

Figure 3:
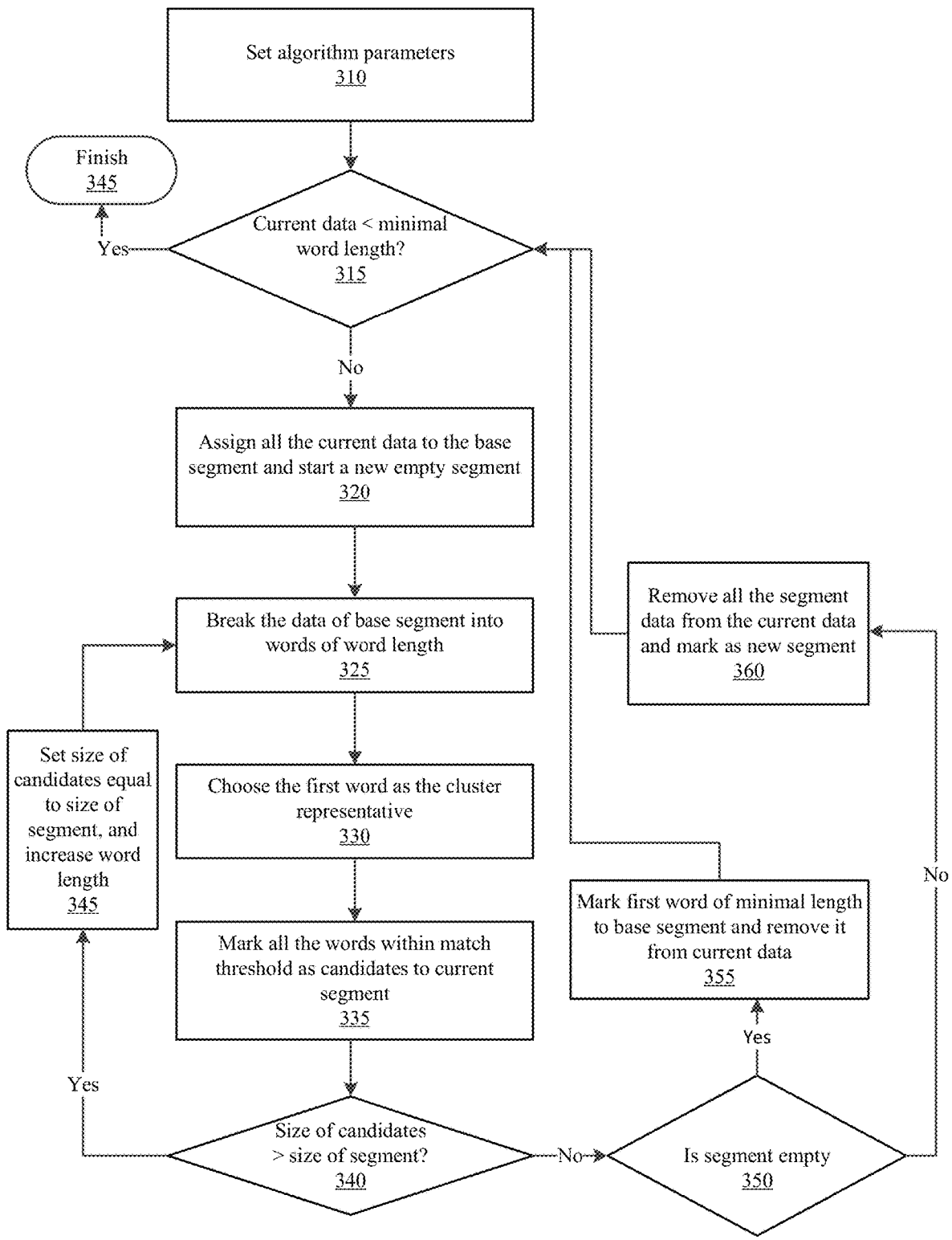
FIG. 3 is a flow chart illustrating a process of decoding data, according to one or more example embodiments.

With reference to FIG. 3, an example process may include choosing a minimal word length and searching for similarity between candidates of that given size. Then, in an iterative manner, the word length can be increased and it can be evaluated whether each segment can explain longer words. For example, each segment, which identifies data that with sufficiently similar source statistics, can be enlarged so that the segments are sufficiently different from each other (i.e., sufficiently unique or distinct). However, as the word length is increased, the similarity score changes and some of the candidates may no longer fit to the segment. In data segmentation, there is an inherent tradeoff between the amount of data described by each segment and the accuracy of the description. Adding more elements may make the description inaccurate, but too few elements will cause insufficient statistics. As the playground is narrow and the amount of data is very limited, the process can maximize the amount of data that can be explained by a new segment, using a similarity measure.

Thus, in each iteration of the algorithm, it is checked whether a particular length explains more data than the previous iteration. This may be repeated in an iterative manner until there is convergence to a size that can explain most of the data.

More specifically, process 300 (which may be performed by, e.g., decoding controller 220) may begin at 310 by setting algorithm parameters, such as minimal word length (e.g., minimal_word_length), such as 10 bytes, and match threshold (e.g., match_threshold), such as a correlation coefficient of 0.05. Additionally, at 310, we may begin by choosing to analyze all the data to be decoded (e.g., curr_data may be set to all the data). At 315, it may be determined whether the current data is less than the minimal word length (e.g., is curr_data<minimal_word_length). If yes, then process 300 may be ended at 345 (because the data is no larger than the minimal word length). If the current data is not less than the minimal word length, then at 320, all of the current data may be assigned to a base segment and a new empty segment may be started. Moreover, at 320, word length may be set to the minimal word length (e.g., word_length=minimal_word_length). Here, base segment is a background segment, and we may begin by assuming that all data is explained by just a background segment that has all the data in it, and from the base segment, pieces of data that can be explained will be cherry picked. It is noted that, if the data is random, there is no correlation to find and there may be one base segment.

At 325, the data of the base segment may be broken into words of the word length (e.g., words of word_length). At 330, the first word may be chosen as a cluster representative. At 335, all the words that are of distance less than the match threshold from the representative are marked as candidates for the current segment (e.g., distance<match_threshold). At 340, it may be determined whether a size of the candidates is greater than a size of the segment (e.g., size in bytes>size of segment with the previous word length size). If the size of the candidates is greater than the size of the segment, then at 345, the size of the candidates is set to be equal to the size of the segment, the word length is enlarged, and process 300 returns to step 325. If the size of the candidates is not greater than the size of the segment, then at 350, it is determined whether the segment is empty. If the segment is empty, then at 355, the first word of minimal word length (minimal_word_length) may be marked to the base segment and removed from the current data (curr_data). Process 300 may then return to step 315. If the segment is not empty, then at 360, all the segment data may be removed from current data (curr_data) and mark the segment as a new segment, and process 300 may return to step 315.

In one approach, the similarity measurement can be adjusted to find data repetitions, which are more suitable for a case where the data is very structured. These can be traced using correlation measurements on the data itself like the Hamming distance between words, taking only words that are very similar. Thus, creating short segments that have a narrow coverage but explain the data with a very high certainty. The Hamming distance can be found using the following formula:

$$D_H(x, y) = \sum_i Di(x_i, y_i) \quad \text{Eq. 2}$$

$$Di(a, b) = \begin{cases} 1 & a \neq b \\ 0 & a = b \end{cases}$$

In another approach, an attempt is made to explain the data by segments that come from different sources, in which case it may be preferable to search for longer words that are less correlated but have similar statistics. In such a case, using a local histogram correlation, such as the Jensen-Shannon Divergence (JS), which can be found in the following manner:

$$JS(P, Q) = KL(P, M) + KL(Q, M) \quad \text{Eq. 3}$$

$$M = \frac{P + Q}{2}$$

$$KL(P, Q) = \sum_i P_i \log \frac{P_i}{Q_i}$$

Alternatively or additionally, the Kullback Leibler Divergence (KL) may be used. In various embodiments, the Jensen-Shannon Divergence can be a symmetric and more robust correlation than the Kullback Leibler Divergence, which measures the distance between distributions, or one of its generalizations, and may yield better results.

Figure 4B:
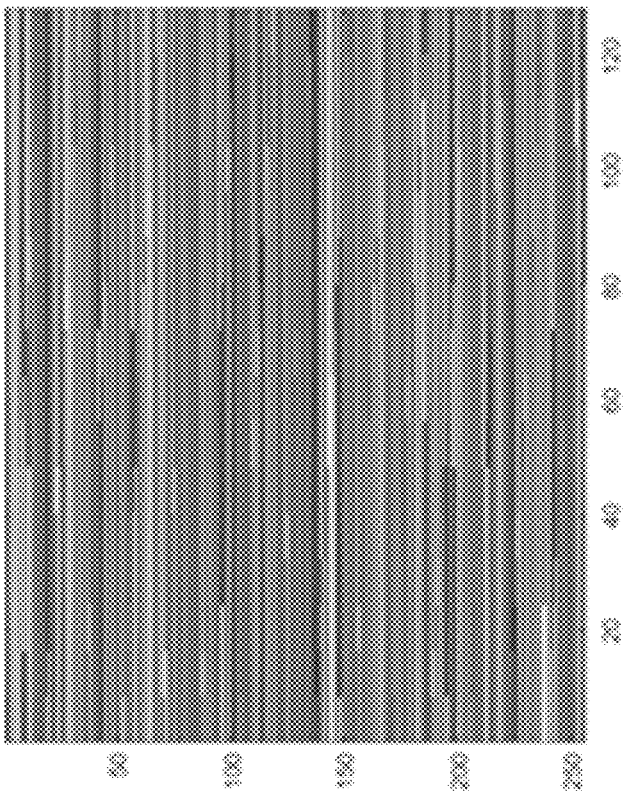
FIGS. 4A and 4B depict segment maps for 4K of data represented as stacked 128-bit chunks, according to one or more example embodiments.
Figure 4A:
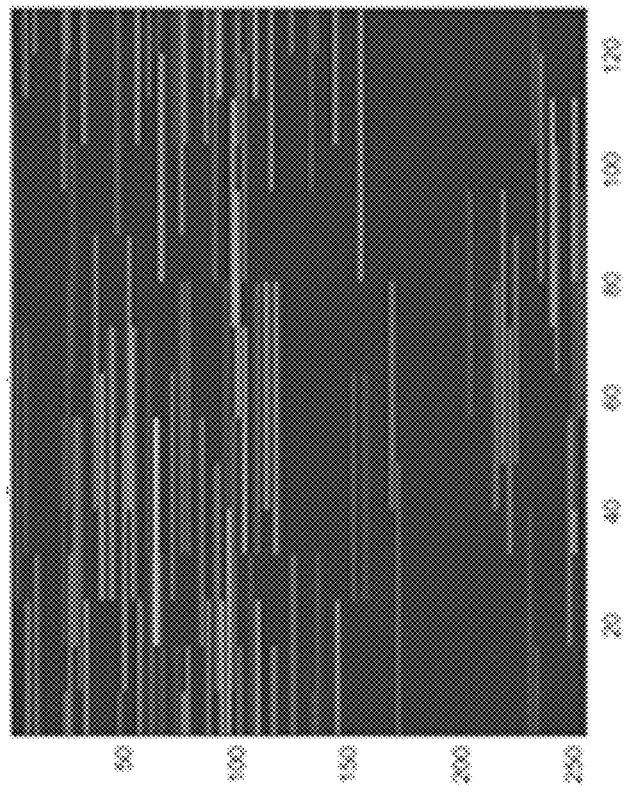

Referring to FIGS. 4A and 4B, the images depict 4K of data represented as stacked 128-bit chunks. Each shade corresponds to a different segment. It is noteworthy that segments (color encoded) contain disjoint fragments.

In alternative implementations, a softer measurement may be used, assuming the data may be explained by more than one source. This is especially useful if it is desired to find large segments, which are rich in data, but are less accurate in their description. In such a case, a clustering method (e.g., k-means, mean shift, etc.) may be used to obtain large segments. Using such a technique, a larger segment may "swallow" smaller ones and often their data will be divided between several segments. Using a softer measurement will allow assigning each bit to a different segment with probability (e.g., an inverse function of the distance to the cluster center or the sample closest to the center). The same distance measure that was used in the clustering may apply here. The new term for a bit LLR may be determined using Equation 1.

Figure 5:
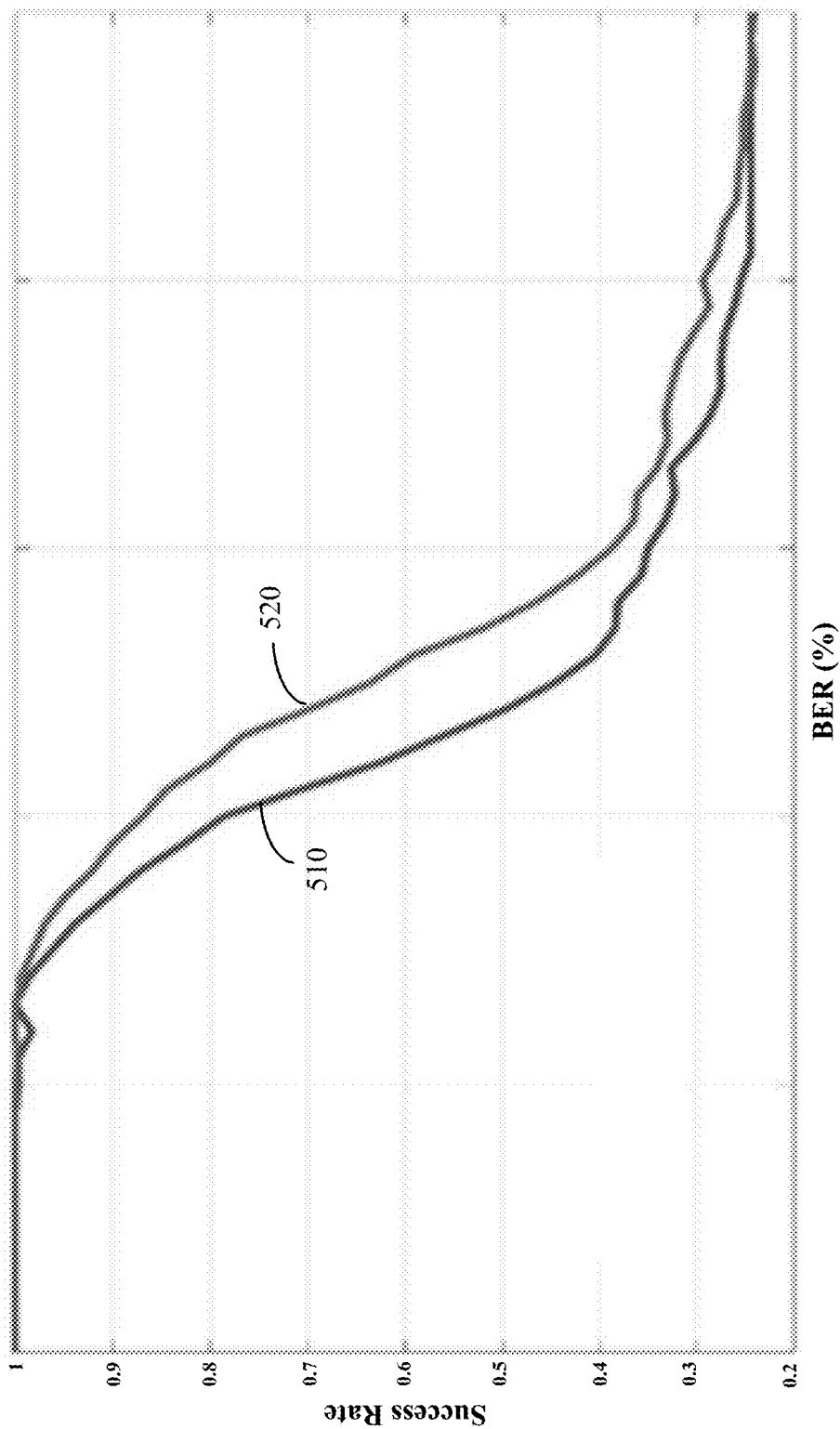
FIG. 5 depicts decode success rate as a function of the bit error rate, according to one or more example embodiments.

The graph in FIG. 5 shows the decode success rate as a function of the bit error rate (BER), where line 510 corresponds with a reference Content Aware (CA) decoder, and line 520 demonstrates the same CA decoder where local statistics where obtained using segmentation. Embodiments of the disclosed technique improves decode success rate and converges faster, yielding improved latency. The depiction in FIG. 5 was obtained using short word correlation; other methods yield similar results.

In another aspect, an algorithm may be used to find how many partitions the data have and where the separation points between the different partitions are positioned. The goal of the algorithm is to divide an array of characters into chunks that are distinct in their distribution while using a minimal number of partitions.

Figure 7:
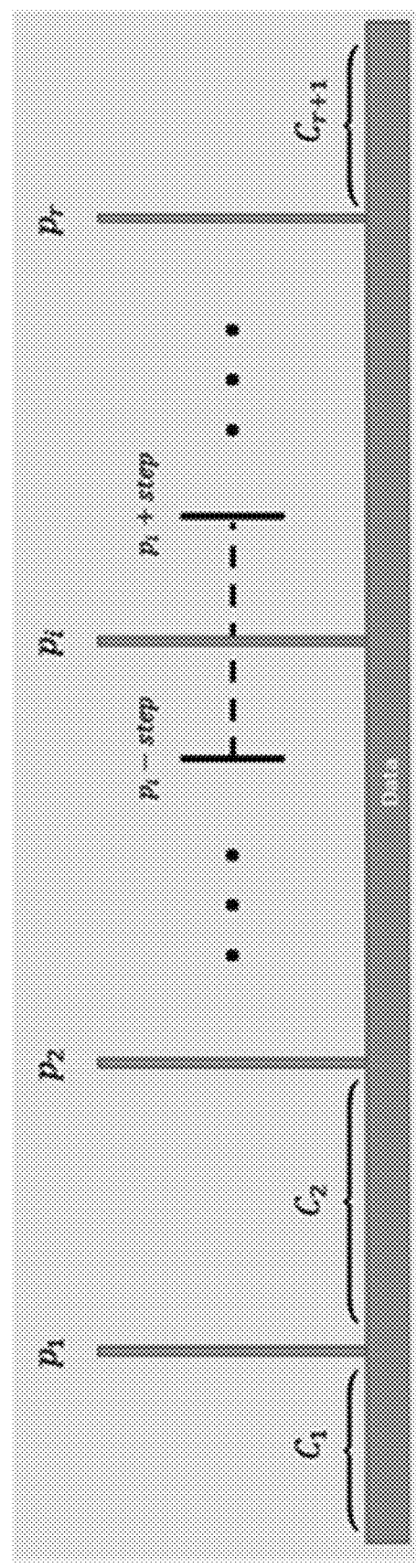
FIG. 7 depicts example portioning parameters, according to one or more example embodiments.

In various embodiments, the following parameters and definitions may apply: r may represent the initial number of partitions, which is the maximum number of partitions;

$p_1, \ldots, p_r$ may represent the partition (separation) points; $C_1, \ldots, C_{r+1}$ may represent the chunks induced by the partitions; step may represent the maximum distance a partition can be moved in a single step; and join_threshold may represent the threshold which determines whether two chunks are similar enough to be merged. These parameters are illustrated in an example depicted in FIG. 7.

In various embodiments, the algorithm may use the following functions in order to achieve its goal.

First, $(p_1, \ldots, p_r)$ may indicate how uniform the data chunks/data partitions are: a low score corresponds with the chunks being less uniform (more eccentric). For example, the following formula may be used to obtain an entropy metric:

$$\text{Score}(p_1, \ldots, p_r) = \sum_{i=1}^{r+1} H(C_i) \cdot |C_i| \quad \text{Eq. 4}$$

In Equation 4, $|C_i|$ is the size of chunk and if the distribution (or source statistics) are represented by byes, then $|C_i|$ will be counted in bytes as well. Also in Equation 4, $H(C_i)$ is the chunk's entropy, obtainable using the following formula:

$$H(C_i) = \sum_k P_k^i \cdot \log\left(\frac{1}{P_k^i}\right) \quad \text{Eq. 5}$$

Where $P^i$ is the distribution of chunk i. This distribution can be, as an example, a byte-histogram of the specific chunk.

This score function defines uniformity by means of entropy. It additionally avoids trivial cases by not creating chunks that are nearly empty.

$\text{Div}(C_1, C_2)$ indicates how similar two chunks are distribution-wise. In certain implementations, the Kullback-Leibler Divergence may be used.

$$\text{Div}(C_i, C_j) = D_{KL}(P^i || P^j) = \sum_k P_k^i \cdot \log\left(\frac{P_k^i}{P_k^j}\right) \quad \text{Eq. 6}$$

The above set of functions is only an example and other functions, with similar properties, can also be used.

Figure 8:
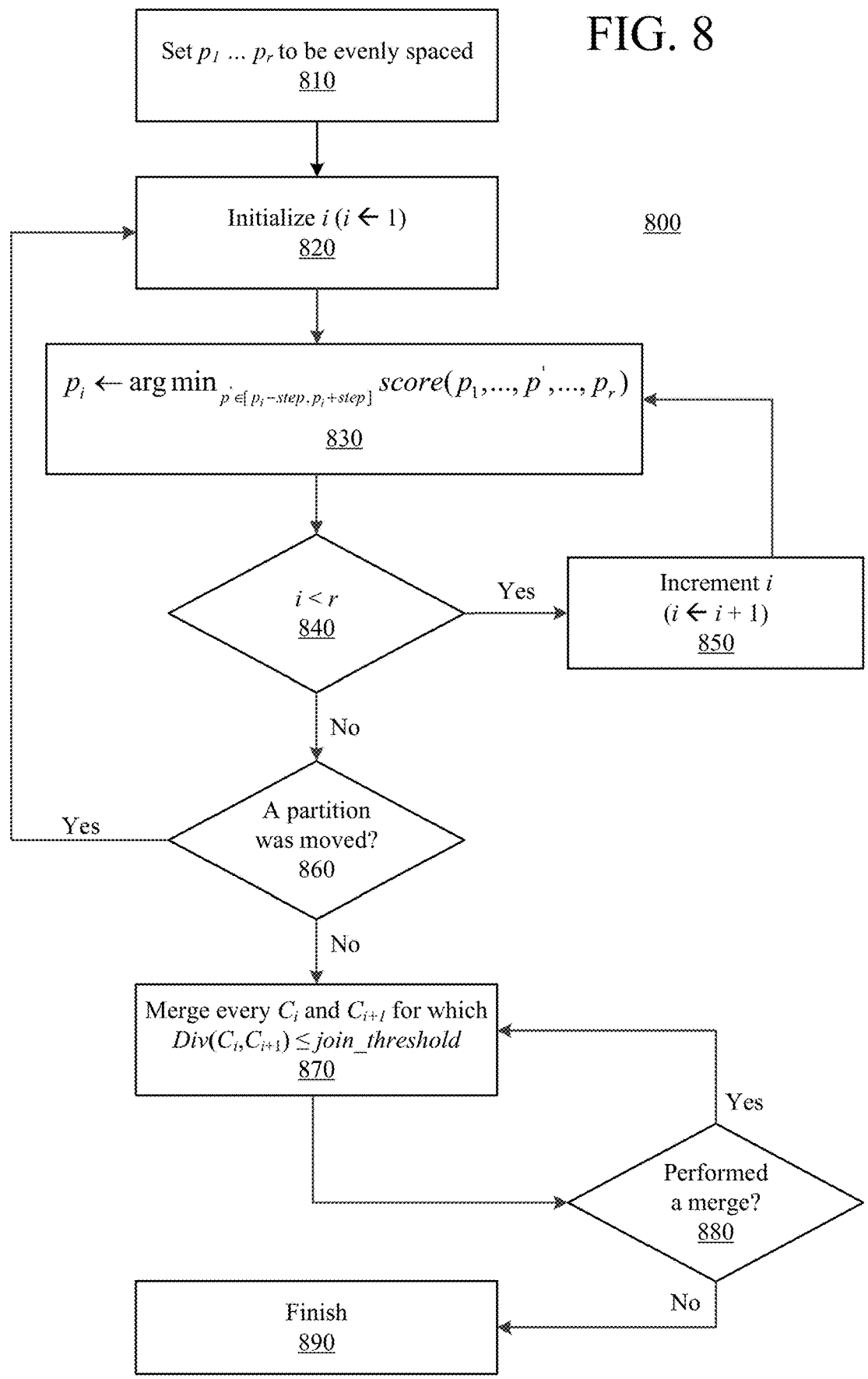
FIG. 8 is a flow chart illustrating a partitioning process for enhanced encoding, according to one or more example embodiments.

Referring to FIG. 8, a portioning algorithm 800 according to various embodiments will now be described: (i) a-priori place the partitions evenly spaced (810); (ii) iterate over the partitions, moving each partition to the location which reduces the score the most in a distance of step from the partition's current location (820, 830); (iii) keep iterating over the partitions until a full pass has been completed without moving any partition (840, 850, 860); (iv) go over the partitions from left to right, and if the Div between two neighboring chunks is less than join_threshold, remove the partition and unite the chunks (870); (v) keep iterating over the remaining partitions until no partition is removed (880, 890).

In various embodiments, with respect to 810, the partitions $p_1 \ldots p_r$ are evenly spaced as part of the initialization. At 820, i is initialized to 1; this is the beginning of a for-loop that goes over all the partitions $p_1 \ldots p_r$ to determine whether there is a better partitioning by moving at least one of the partitions such that the score$(p_1 \ldots p_r)$ is improved based on the definition of Equation 4. Going over all r partitions is considered as a full pass. At 830, for a specific $p_i$, it is checked whether moving the $p_i$ will improve the score. The new candidate for the new $p_i$ is in the range between the old $p_i$ minus step and the old $p_i$ plus step. The new $p_i$ is placed at the location that corresponds to the best score. At 840, it is checked whether a full pass has completed, or whether the process should continue with increased i. At 850, i is increased and the next partition is checked (i.e., back to 830). At 860, once a full pass is completed, it is checked whether at least one of the partitions has been changed. If so, another full pass will be started. In case a full pass is completed and none of the partitions had been changed, then the for-loop of full passes ends and the process continues to the next stage in which it is checked whether adjacent partitions can be combined. At 870, the condition to combine two adjacent chunks is defined by calculating the distance between the adjacent chunks according to Equation 6, for example, and comparing the distance to a predefined threshold join_threshold. If the condition is satisfied for $C_i$ and $C_{(i+1)}$ then $p_i$ is removed and the number of partitions is decreased. At 880, it is checked whether there was a merge of adjacent chunks. If so, there is another pass on all consecutive chunks in order to check if additional merges can be done. Once such a pass is completed without additional merges, the algorithm is finished.

In another aspect, a rearrange transformation is used in order to uncover the hidden structure of the data. After the rearrangement, the decoder can use predefined partitions, and where partitions have unique source statistics, correction capabilities are enhanced. In various implementations, to achieve maximum gain, the partitioning algorithm may be used to find the optimal division into partitions. A summary of various embodiments of the disclosure is illustrated via FIGS. 9A and 9B.

Figure 9A:
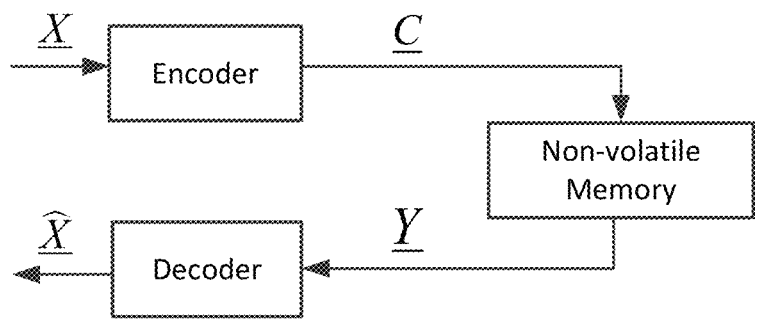
FIG. 9A depicts a conventional data encoding and decoding scheme.

FIG. 9A depicts the conventional scheme which consists of only a regular encoder and a content-aware decoder. The data to be encoded is represented by X and after encoding, the data receives a codeword C for error correction. After being stored in a non-volatile memory and being read, a noisy version of the data, denoted by Y, is obtained. The decoder will receive Y as an input and produce the output $\hat{X}$ after the decoding. Successful decoding will be obtained when $\hat{X}$ is equal to X.

Figure 9B:
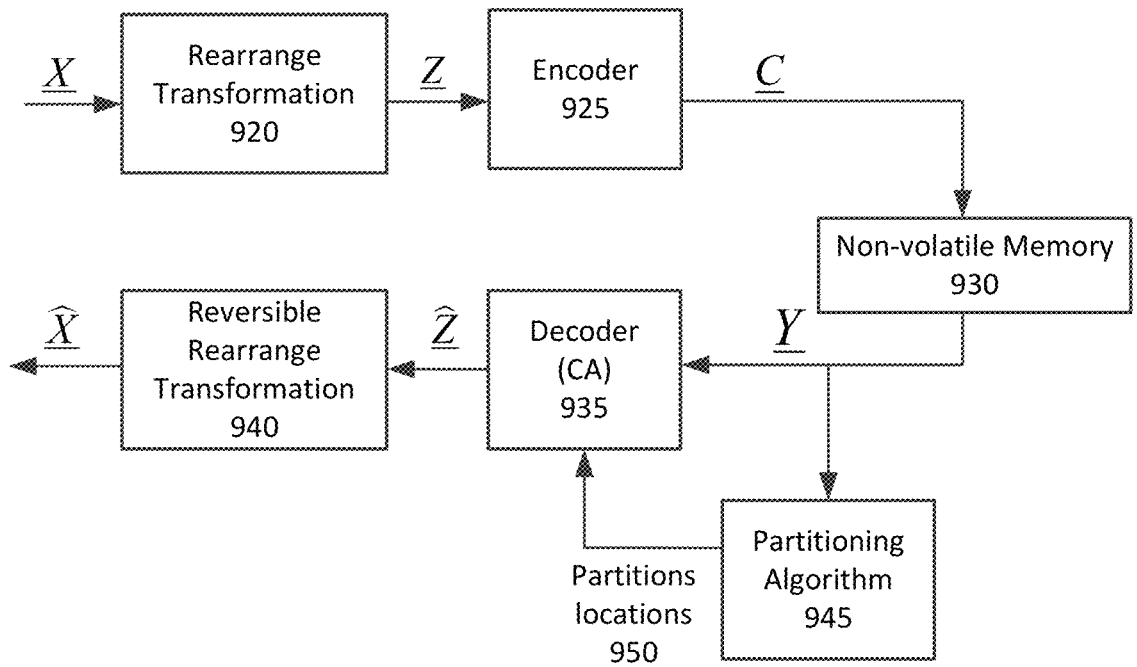
FIG. 9B depicts a data encoding and decoding scheme with rearranging and/or partitioning of data, according to one or more example embodiments.

FIG. 9B depicts various embodiments of the disclosed approach, in which a rearrange transformation 920 is applied to X prior to encoding by an encoder 925 (e.g., encoder 236). The output following the transformation is denoted by Z. After encoding, the data receives a codeword C and is stored in non-volatile memory 930. The CA decoder 925 (e.g., decoder 226) in the illustrated approach receives the read data Y and also the partitions locations 950 found by an partitioning algorithm 945 (e.g., the algorithm of FIG. 8). Once decoding finishes successfully and output $\hat{Z}$ is obtained, the inverse transformation 940 can be applied in order to obtain $\hat{X}$. Successful decoding will be achieved when $\hat{X}$ is equal to X.

Figure 10:
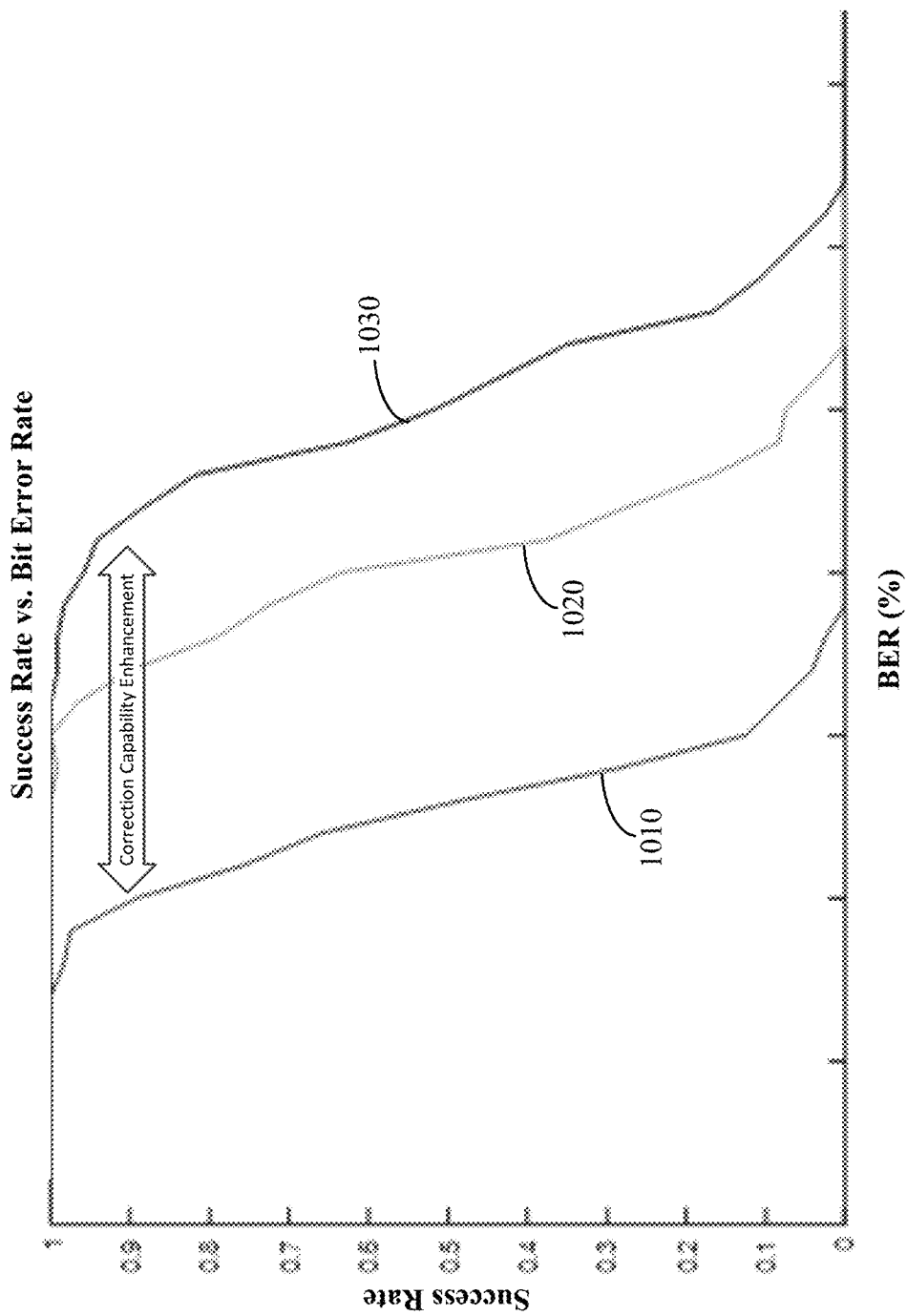
FIG. 10 illustrates improvement in correction capability that may be achieved using embodiments of the disclosed approach.

FIG. 10 illustrates improvement in correction capability achieved using the disclosed approach. The X-axis corresponds to the bit error rate (probability for a bit flip) in percentages and the Y-axis corresponds to the decode success rate. Curve 1010 on the left corresponds to the conventional scheme, curve 1020 in the middle corresponds to an example scheme in which the rearrange transformation is BW transform and predefined partitions are used. The predefined partitions location may be chosen to be each quarter of the data. Curve 1030 on the right corresponds to an example scheme in which the rearrange transformation is BW transform and the partitions location are found using the partitioning algorithm described.

Consequently, in various implementations, combining the rearrangement module and the partitioning algorithm may achieve maximum gain (e.g., an increase in correction capability of 20%). In other implementations, one of the components can be used by itself to achieve significant gain.

A storage system using the disclosed approach can improve its endurance and reduce firmware overhead related to error handling. Such a system can also improve decoding latency and improve the QoS profile of the system. Various embodiments may be especially useful to patterned data, which describes management tables and other management data. This management information is of great importance to the system's operation, and improving its storage reliability is crucial.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system. While certain embodiments may be implemented in a controller, other embodiments may be implemented in a host system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A memory controller, comprising:
    one or more circuits configured to:
        receive encoded data from a memory device,
        segment the encoded data into multiple segments,
        determine that two segments of the multiple segments should be combined into a new segment based on a comparison of a distance between the same two segments to a predefined join threshold,
        combine the two segments into the new segment,
        decode the new segment via application of a first set of decoder parameters,
        decode a first segment of the multiple segments different from the new segment via application of a second set of decoder parameters different from the first set of decoder parameters, and
        transmit decoded data including the decoded new segment and the decoded first segment to a host system.

2. The memory controller of claim 1, wherein the one or more circuits are configured to segment the encoded data at least in part by choosing a size and determining similarity between segment candidates of the chosen size, the first set of decoder parameters includes a first confidence level assigned to each bit within the new segment and the distance comprises a Hamming distance between the two segments.

3. The memory controller of claim 2, wherein the one or more circuits are configured to determine similarity at least in part by determining Hamming distance between segment candidates.

4. The memory controller of claim 2, wherein the one or more circuits are configured to determine similarity at least in part by determining at least one of Jensen-Shannon Divergence and Kullback Leibler Divergence between segment candidates.

5. The memory controller of claim 2, wherein the one or more circuits are configured to determine similarity at least in part by determining whether segment candidates have a correlation metric exceeding a correlation threshold.

6. The memory controller of claim 5, wherein the one or more circuits are configured to join segment candidates together into a single segment if the correlation metric between the segment candidates exceeds the correlation threshold.

7. The memory controller of claim 5, wherein the one or more circuits are configured to iteratively increase segment size.

8. The memory controller of claim 1, wherein the one or more circuits are further configured to receive unencoded data from the host system, encode the unencoded data to obtain the encoded data, and transmit the encoded data to the memory device for storage.

9. The memory controller of claim 8, wherein the one or more circuits are further configured to perform an invertible transformation on the unencoded data prior to encoding the data so as to rearrange the data into a collection of partitions with unique source statistics.

10. The memory controller of claim 9, wherein the one or more circuits are configured to perform the invertible transformation at least in part by performing a Burrows-Wheeler transform.

11. The memory controller of claim 9, wherein the one or more circuits are further configured to find separation points between partitions in the collection of partitions so as to reduce an entropy metric for the collection of partitions.

12. The memory controller of claim 1, wherein the one or more circuits are configured to decode each segment of the multiple segments by applying decoder parameters optimized for the segment according to source statistics of the segment.

13. A memory controller, comprising:
    one or more circuits configured to:
        receive data from a host system,
        rearrange the received data into a collection of partitions,
        encode the rearranged collection of partitions to generate encoded data,
        store the encoded data in a memory device,
        acquire the encoded data from the memory device,
        partition the encoded data into multiple segments,
        detect that two segments of the multiple segments should be unified into a new segment based on a comparison of a distance between the same two segments to a predefined join threshold,
        unify the two segments into the new segment,
        decode the new segment via application of a first set of decoder parameters,
        decode a second segment of the multiple segments different from the new segment via application of a second set of decoder parameters different from the first set of decoder parameters, and
        transmit decoded data including the decoded new segment and the decoded second segment to the host system.

14. The memory controller of claim 13, wherein the first set of decoder parameters includes a first confidence level assigned to each bit within the new segment and the second set of decoder parameters includes a second confidence level different from the first confidence level assigned to each bit within the second segment.

15. The memory controller of claim 13, wherein the one or more circuits are configured to rearrange the received data at least in part by performing an invertible transformation on the received data, the distance comprises a Hamming distance between the two segments.

16. The memory controller of claim 13, wherein the one or more circuits are further configured to determine separation points for the collection of partitions.

17. The memory controller of claim 16, wherein the one or more circuits are configured to determine separation points for the collection of partitions at least in part by determining separation points between partitions in the collection of partitions so as to reduce an entropy metric for the collection of partitions.

18. The memory controller of claim 13, wherein the one or more circuits are further configured to decode the encoded data to obtain the decoded data, and perform an inverse transformation on the decoded data.

19. The memory controller of claim 18, wherein the one or more circuits are configured to perform the invertible transformation at least in part by performing a Burrows-Wheeler (BW) transform.

20. A method of controlling a memory system, the method comprising:
- acquiring encoded data from a memory device;
- partitioning the encoded data into a plurality of segments;
- detecting that two segments of the plurality of segments should be unified into a new segment based on a comparison of a Hamming distance between the same two segments to a predefined join threshold;
- combining the two segments into the new segment;
- decoding the new segment via application of a first set of decoder parameters;
- decoding a first segment of the plurality of segments different from the new segment via application of a second set of decoder parameters different from the first set of decoder parameters; and
- transmit decoded data including the decoded new segment and the decoded first segment to a host system.

\* \* \* \* \*